US010573808B1

(12) United States Patent
Saraf et al.

(10) Patent No.: US 10,573,808 B1
(45) Date of Patent: Feb. 25, 2020

(54) PHASE CHANGE MEMORY WITH A DIELECTRIC BI-LAYER

(71) Applicant: International Business Machines Corporation, Armonk, NY (US)

(72) Inventors: Iqbal Rashid Saraf, Cobleskill, NY (US); Kevin W. Brew, Albany, NY (US); Injo Ok, Loudonville, NY (US); Nicole Saulnier, Slingerlands, NY (US); Robert Bruce, White Plains, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/107,323

(22) Filed: Aug. 21, 2018

(51) Int. Cl.
*H01L 45/00* (2006.01)

(52) U.S. Cl.
CPC .......... *H01L 45/06* (2013.01); *H01L 45/1253* (2013.01); *H01L 45/1608* (2013.01); *H01L 45/1675* (2013.01)

(58) Field of Classification Search
CPC ...................................................... H01L 45/06
See application file for complete search history.

(56) References Cited

U.S. PATENT DOCUMENTS

| 7,407,879 | B2 * | 8/2008 | Nicholson | ......... | H01L 21/76828 257/E21.576 |
| 7,495,946 | B2 | 2/2009 | Gruening-von Schwerin et al. | | |
| 7,619,237 | B2 | 11/2009 | Lung | | |
| 7,750,332 | B2 * | 7/2010 | Sakamoto | ........... | G11C 13/0011 257/2 |
| 7,750,335 | B2 | 7/2010 | Clevenger et al. | | |
| 8,119,528 | B2 | 2/2012 | Schrott et al. | | |
| 8,871,559 | B2 * | 10/2014 | Horii | ................... | H01L 27/2409 438/253 |
| 8,889,544 | B2 * | 11/2014 | Wu | ................... | H01L 21/02203 257/774 |
| 8,937,011 | B2 | 1/2015 | Iuchi et al. | | |
| 9,172,036 | B2 * | 10/2015 | Chen | ................... | H01L 45/1253 |
| 9,196,654 | B2 | 11/2015 | Boivin | | |
| 9,246,093 | B2 | 1/2016 | Zanderighi et al. | | |
| 9,299,745 | B2 * | 3/2016 | Zhang | ..................... | H01L 43/12 |
| 9,336,879 | B2 | 5/2016 | Lung et al. | | |
| 9,691,974 | B2 * | 6/2017 | Li | ......................... | H01L 45/144 |
| 10,211,054 | B1 * | 2/2019 | BrightSky | ......... | H01L 21/02485 |
| 2006/0228853 | A1 * | 10/2006 | Jeong | ..................... | B82Y 10/00 438/238 |
| 2008/0020594 | A1 * | 1/2008 | Kim | .................... | H01L 27/2436 438/787 |
| 2011/0065252 | A1 * | 3/2011 | Nakamura | .......... | H01L 27/2436 438/382 |
| 2011/0115090 | A1 * | 5/2011 | Lin | ..................... | H01L 21/0276 257/750 |
| 2011/0155993 | A1 | 6/2011 | Chen | | |

* cited by examiner

Primary Examiner — William Coleman
(74) Attorney, Agent, or Firm — Amin, Turocy & Watson, LLP

(57) ABSTRACT

Techniques regarding protecting a dielectric material during additive patterning of one or more phase change memories are provided. For example, one or more embodiments described herein can comprise a method, which can comprise forming a bi-layer adjacent a phase change memory element. The bi-layer can comprise a dielectric material and a capping material that can protect a thickness of the dielectric material during a patterning process.

20 Claims, 10 Drawing Sheets

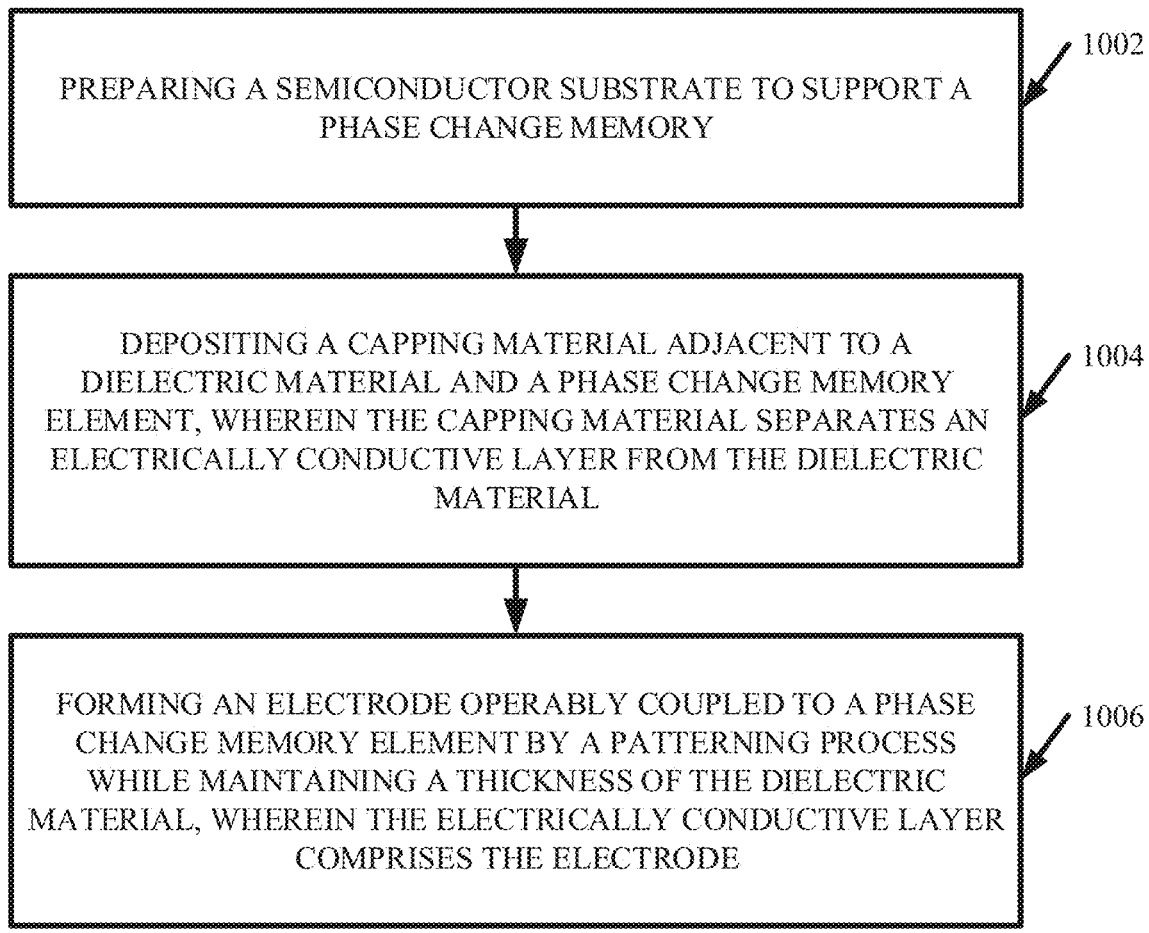

PHASE CHANGE MEMORY WITH A DIELECTRIC BI-LAYER

BACKGROUND

The subject disclosure relates to a phase change memory with a dielectric bi-layer, and more specifically, to a phase change memory with a dielectric bi-layer that can enable one or more additive patterning processes.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, apparatus and/or methods regarding one or more phase change memories comprising one or more dielectric bi-layers that can facilitate one or more additive patterning processes are described.

According to an embodiment, a method is provided. The method can comprise forming a bi-layer adjacent a phase change memory element. The bi-layer can comprise a dielectric material and a capping material that can protect a thickness of the dielectric material during a patterning process.

According to an embodiment, a method is provided. The method can comprise forming an electrode that can be operably coupled to a phase change memory element by a patterning process while maintaining a thickness of a dielectric material located adjacent to the phase change memory element.

According to an embodiment, an apparatus is provided. The apparatus can comprise an electrode that can be operably coupled to a phase change memory element. The apparatus can also comprise a bi-layer adjacent to the first electrode the phase change memory element. The bi-layer can comprise a dielectric material and an etch-resistant capping material that is positioned between the dielectric material and the electrode.

BRIEF DESCRIPTION OF THE DRAWINGS

FIG. 10 illustrates a flow diagram of an example, non-limiting method that can facilitate manufacturing a phase change memory that can comprise one or more dielectric bi-layers, which can facilitate one or more additive patterning processes, in accordance with one or more embodiments described herein.

DETAILED DESCRIPTION

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

Cognitive devices, such as phase change memories, can comprise materials that can not be dry etched due to safety concerns and/or chamber contamination concerns. Additive patterning integrations can allow capping of these materials with one or more conductive electrodes. For example, phase vapor deposition techniques can deposit metal and/or metal nitrides at low temperatures. However, phase vapor depositions and/or electrode etching can damage common dielectrics (e.g., dielectrics with low dielectric constants) that surround critical features of the cognitive devices. Further, subsequent wet etching processing from the additive patterning integration can remove damaged dielectric material; thereby forming one or more recesses that can expose one or more sensitive feature of the cognitive devices.

Various embodiments provided herein can include apparatuses and/or methods regarding phase change memories that can comprise a protective bi-layer, which can facilitate one or more additive patterning processes. For example, one or more embodiments can comprise a bi-layer having a capping material adjacent to a dielectric material, wherein the capping material can protect the dielectric material from various forms of degradation during one or more additive patterning processes. Additionally, the one or more embodiments described herein can facilitate additive patterning of one or more electrodes while maintaining an integrity of a dielectric layer adjacent to one or more phase change memory elements. For instance, an etch resistant capping material can protect the dielectric material from damage incurred by one or more patterning processes (e.g., various etching techniques).

Figure 1:
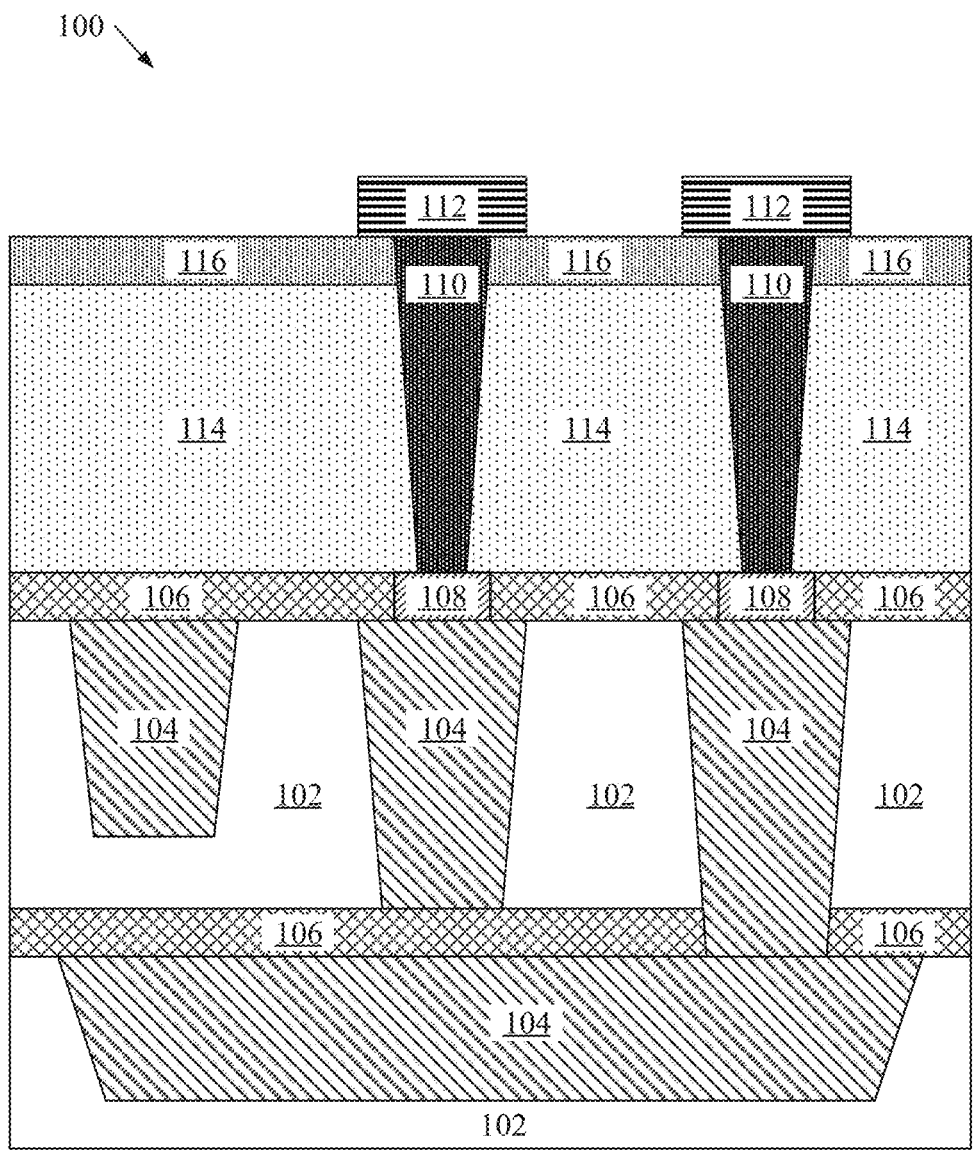
FIG. 1 illustrates a diagram of an example, non-limiting phase change memory that can comprise one or more dielectric bi-layers, which can facilitate one or more additive patterning processes, in accordance with one or more embodiments described herein.
Figure 1:
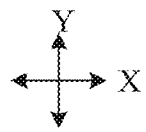

FIG. 1 illustrates a diagram of an example, non-limiting phase change memory structure 100 that can comprise one or more bi-layers, which can facilitate one or more additive patterning processes, in accordance with one or more embodiments described herein. As shown in FIG. 1, the phase change memory structure 100 can comprise one or more phase change memory units located on a semiconductor substrate 102. In one or more embodiments, the semiconductor substrate 102 can be a silicon-on-insulator ("SOI"). For example, the semiconductor substrate 102 can comprise a buried oxide layer and/or a silicon wafer layer (e.g., a complementary metal-oxide-semiconductor "CMOS" wafer).

In one or more embodiments, the semiconductor substrate 102 can comprise one or more landing pads 104. As shown in FIG. 1, the one or more landing pads 102 can be characterized by various sizes and/or dimensions. Further, the one or more landing pads 102 can facilitate one or more electrical connections within the phase change memory structure 100. For example, a first landing pad 104 can be located in one or more base layers of the semiconductor substrate 102. Also, the one or more phase change memory units can be located on top of one or more second landing pads 104 in the vertical direction (e.g., represented by the "Y" axis in FIG. 1). Multiple landing pads 104 (e.g., second landing pads 104) can be located adjacent to each other along the horizontal direction (e.g., represented by the "X" axis in FIG. 1); thereby facilitating the positioning of multiple phase change memory units along the horizontal direction. The one or more landing pads 104 can comprise one or more conductive materials, which can include, but are not limited to: tungsten, copper, and/or the like. One of ordinary skill in the art will recognize that the length (e.g., along the vertical direction represented by the "Y" axis) and/o the width (e.g., along the horizontal direction represented by the "X" axis) can vary depending on the desired properties and/or functionality of the one or more phase change units. For example, the width of the one or more landing pads 104 (e.g., the one or more second landing pads 104 upon which the one or more phase change memory units are located) can range from about greater than or equal to 36 nanometers (nm) to less than or equal to 56 nm. The semiconductor substrate 102 can also comprise one or more dielectric capping layers 106 (e.g., a nitrogen-doped silicon carbide ("NBLOK"), silicon nitride, and/or the like).

The one or more phase change memory units can comprise a first electrode 108 (e.g., a bottom electrode), a phase change memory element 110, and a second electrode 112.

The one or more first electrodes 108 can be embedded within one or more of the dielectric capping layers 106. The one or more first electrodes 108 can comprise a conductive material, which can include, but is not limited to: titanium nitride (TiN), titanium (Ti), tungsten nitride (WN), tungsten (W), tantalum nitride (TaN), a combination thereof, and/or the like. Further, in one or more embodiments, the one or more first electrodes 108 can comprise one or more liners, which can include one or more metal nitrides. Respective first electrodes 108 can be operably coupled to respective phase change memory elements 110.

The one or more phase change memory elements 110, can comprise: one or more phase change memory materials, and/or one or more metal nitride liners. The one or more phase change memory materials can be resistance switching materials, which can include, but are not limited to: chalcogenides, perovskites, perovskites-like materials (e.g., colossal magnetoresistance ("CMR") materials and/or high temperature superconductivity ("HTSC") materials), alloys thereof, combinations thereof, and/or the like. The one or more phase change memory materials can switch between an amorphous state (e.g., which can include a semi-amorphous state and/or a semi-crystalline state) and a crystalline state depending on a voltage of current passed through the phase change memory units. In the amorphous state, the phase change memory materials can exhibit a higher resistance; whereas the phase change memory materials can exhibit a lower resistance in the crystalline state. In one or more embodiments, the phase change memory elements 110 can comprise a liner positioned along one or more sides of the phase change memory elements 110. For example, a liner can be positioned along one or more of the vertical sides of the phase change memory units along the vertical direction (e.g., represented by the "Y" axis). For instance, the liner comprising the one or more phase change memory elements 110 can be a metal nitride, such as a tantalum nitride liner. One of ordinary skill in the art will recognize that the length (e.g., along the vertical direction represented by the "Y" axis) and/o the width (e.g., along the horizontal direction represented by the "X" axis) can vary depending on the desired properties and/or functionality of the one or more phase change units. Additionally, the thickness of the one or more liners comprising the one or more phase change memory elements 110 can vary (e.g., ranging from, for example, greater than or equal to 3 nm to 10 nm).

The phase change memory element 110 can be further coupled to the second electrode 112 (e.g., top electrode). The one or more second electrodes 112 can comprise a conductive material, which can include, but is not limited to: TiN, Ti, WN, W, TaN, a combination thereof, and/or the like. For example, in one or more embodiments, the one or more second electrodes 112 can comprise tantalum nitride (TaN). The one or more second electrodes 112 can be formed by one or more additive patterning processes (e.g., phase vapor deposition ("PVD"), reactive-ion etching ("RIE"), wet etching, a combination thereof, and/or the like).

The phase change memory element 110 can be surrounded by a dielectric bi-layer that can comprise a dielectric material 114 and/or a capping material 116. In other words, the one or more phase change memory elements 110 can be embedded within the dielectric bi-layer. The dielectric material 114 can have a low and/or ultra low dielectric constant. For example, the dielectric material 114 can be characterized by a dielectric constant that is less than or equal to about 3.9. Example dielectric materials 114 can include, but are not limited to: porous silicon dioxide, doped silicon dioxide (e.g., fluorine doped and/or carbon doped), organic polymeric dielectrics, silicon based polymeric dielectrics, a combination thereof, and/or the like. One of ordinary skill in the art will recognize that a thickness (e.g., along the vertical direction represented by the "Y" axis) of the dielectric material 114 can vary depending on the desired properties and/or functionality of the one or more phase change units. For example, the dielectric material 114 can have a thickness ranging from greater than or equal to 50 nm to less than or equal to 150 nm.

As shown in FIG. 1, the capping material 116 can be located adjacent to the dielectric material 114 and/or the one or more phase change memory elements 110. For example, at least a portion of the capping material 116 can be positioned between the dielectric material 114 and the one or more second electrodes 112 (e.g., one or more top electrodes). The capping material 116 can be etch resistant and can serve to protect the integrity of the dielectric material 114 during the formation of the one or more second electrodes 112. For instance, the capping material 116 can maintain the thickness (e.g., along the vertical direction represented by the "Y" axis) and/or physical properties of the dielectric material 114 during formation of the one or more second electrodes 112. For example, the capping material 116 can include, but is not limited to: tetraethyl orthosilicate ("TEOS"), silicon nitride, alumina, NBLOK, a combination thereof, and/or the like. One of ordinary skill in the art will recognize that a thickness (e.g., along the vertical direction represented by the "Y" axis) of the capping material 116 can vary depending on the desired properties and/or functionality of the one or more phase change units. For example, the capping material 116 can have a thickness ranging from greater than or equal to 5 nm to less than or equal to 10 nm, In conventional phase change memory structures 100, which lack at least the capping material 116, an attempt to form the one or more second electrodes 112 via additive patterning would result in one or more gauges in the dielectric material 114. For example, one or more PVD and/or RIE patterning process can modify one or more physical properties (e.g., damage) the dielectric material 114. Further, subsequent wet etching processes to form the one or more second electrodes 112 can remove the modified portions of dielectric material 114 from the phase change memory structure 100. Thereby, one or more recesses (e.g., gauges) can be formed on the surface of the dielectric material 114. Further, the resulting recesses can reduce the protection to the one or more phase change memory elements 110 provided by the dielectric material 114. For example, one or more portions of the one or more phase change memory elements 110 can be exposed to a destructive environment (e.g., an environment other than the dielectric material 114).

However, the dielectric bi-layer of the phase change memory structure 100 can enable one or more additive patterning processes to be utilized to form the one or more second electrodes 112 without resulting in damage to the dielectric material 114. The etch resistant nature of the capping material 116 can prevent and/or inhibit the dielectric material 114 from being modified during one or more additive patterning processes (e.g., to form the one or more second electrodes 112). Further, the capping material 116 can prevent and/or inhibit one or more portions from the dielectric material 114 from being removed from the phase change memory structure 100 during one or more additive patterning process (e.g., to from the one or more second electrodes 112). Thus, the thickness and/or physical properties of the dielectric bi-layer (e.g., the capping material 116 and/or the dielectric material 114) can be maintained during one or more additive patterning processes; thereby, protecting the one or more sensitive phase change memory elements 110.

In one or more embodiments, the phase change memory structure 100 can further comprise one or more additional layers. For example, the phase change memory structure 100 can further comprise an additional NBLOK layer located adjacent to the dielectric material 114 and the one or more first electrodes 108 (e.g., the one or more bottom electrodes). For instance, the additional NBLOK layer can be positioned substantially parallel to the capping material 116, but adjacent to the one or more first electrodes 108 as opposed to the one or more second electrodes 112.

Figure 2:
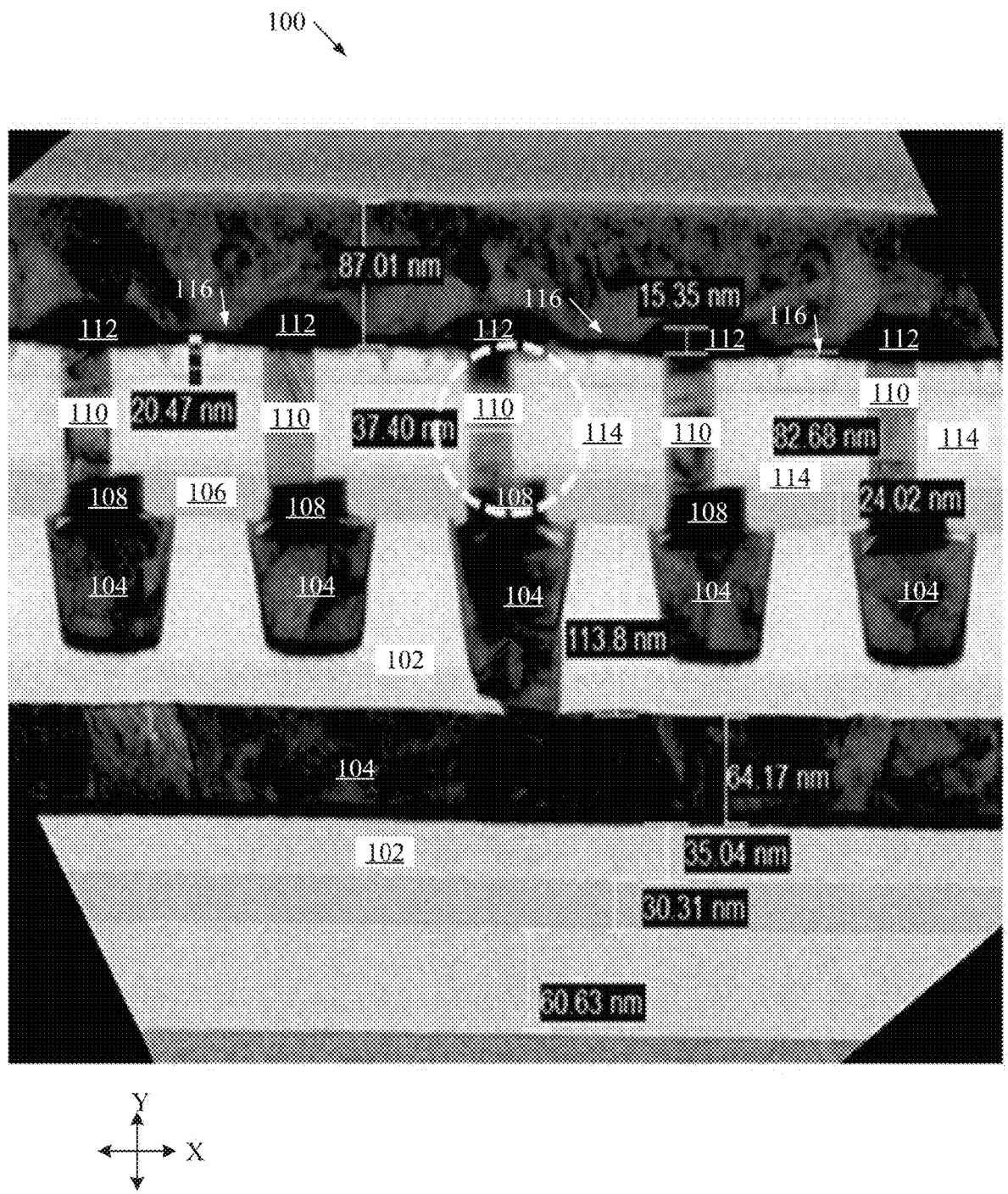
FIG. 2 illustrates a photo of an example, non-limiting phase change memory that can comprise one or more dielectric bi-layers, which can facilitate one or more additive patterning processes, in accordance with one or more embodiments described herein.

FIG. 2 illustrates a photo of an example, non-limiting phase change memory structure 100 that can comprise a dielectric bi-layer in accordance with one or more of the embodiments described herein. Repetitive description of like elements employed in other embodiments described herein is omitted for sake of brevity. The one or more second electrodes 112 shown in FIG. 2 were formed using one or more additive patterning processes.

FIG. 2 can depict the efficacy of the one or more features described herein with regards to FIG. 1. For example, the dashed circle presented in FIG. 2 can highlight that an integrity of the dielectric material 114 can be maintained during and/or subsequent to the formation of the one or more second electrodes 112 (e.g., by one or more additive patterning processes). For instance, as shown in FIG. 2, the dielectric material 114 can be free from one or more gauges that can otherwise be formed during additive patterning processes in conventional structures.

Figure 3:
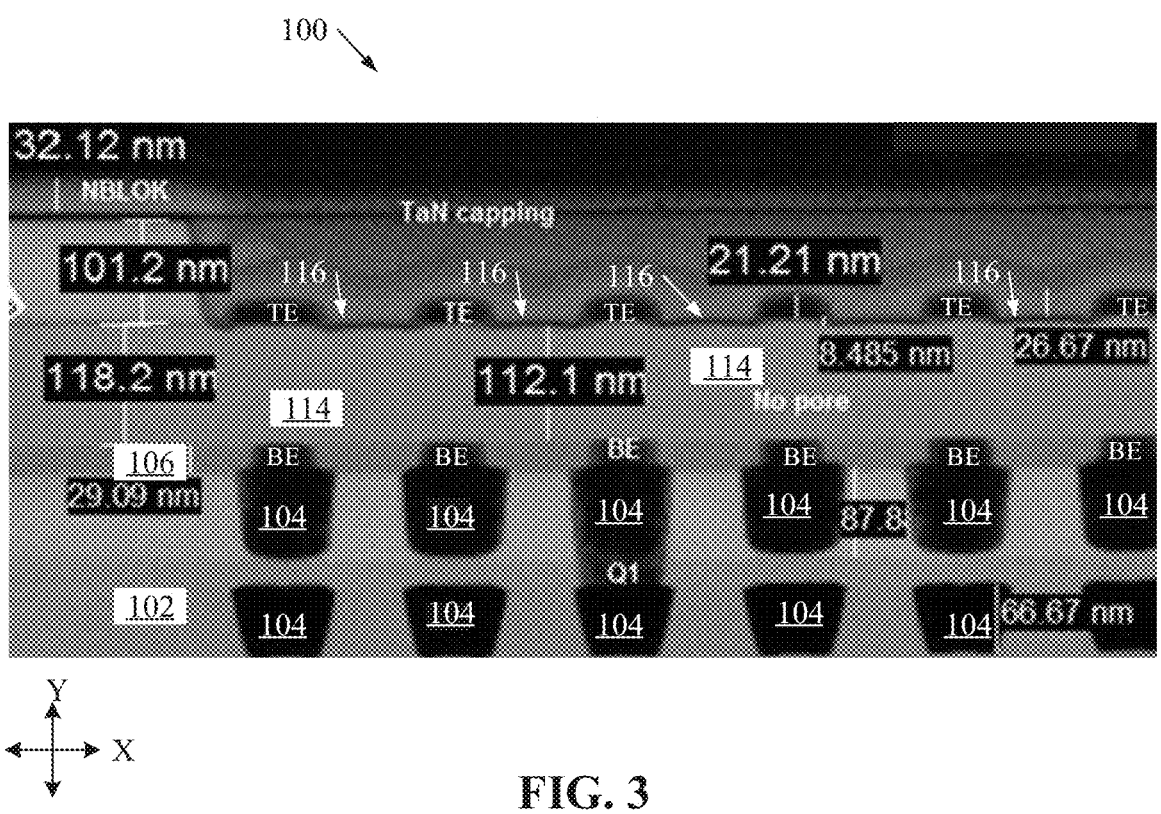
FIG. 3 illustrates a photo of an example, non-limiting phase change memory that can comprise one or more dielectric bi-layers, which can facilitate one or more additive patterning processes, in accordance with one or more embodiments described herein.

FIG. 3 illustrates a photo of an example, non-limiting phase change memory structure 100 that can comprise a dielectric bi-layer in accordance with one or more of the embodiments described herein. Repetitive description of like elements employed in other embodiments described herein is omitted for sake of brevity. For example, to further demonstrate the efficacy of the capping material 116 in maintaining the integrity of the dielectric material 114 during one or more additive patterning processes, FIG. 3 depicts a phase change memory structure 100 absent the one or more phase change memory elements 110. The one or more second electrodes 112 shown in FIG. 3 were formed using one or more additive patterning processes.

As shown in FIG. 3, "TE" can represent one or more top electrodes and can correspond to the one or more second electrodes 112 described herein. Additionally, "BE" can represent one or more bottom electrodes and can correspond to the one or more first electrodes 108 described herein. Further, "no pore" can represent that the phase change memory structure 100 does not include one or more phase change memory elements 110. By presenting the phase change memory structure 100 without the one or more phase change memory elements 110, one of ordinary skill in the art can readily recognize how the dielectric material 114 remained unmodified (e.g., did not develop one or more recesses) during formation of the one or more additive patterning processes that can form the one or more second electrodes 112.

Figure 4A:
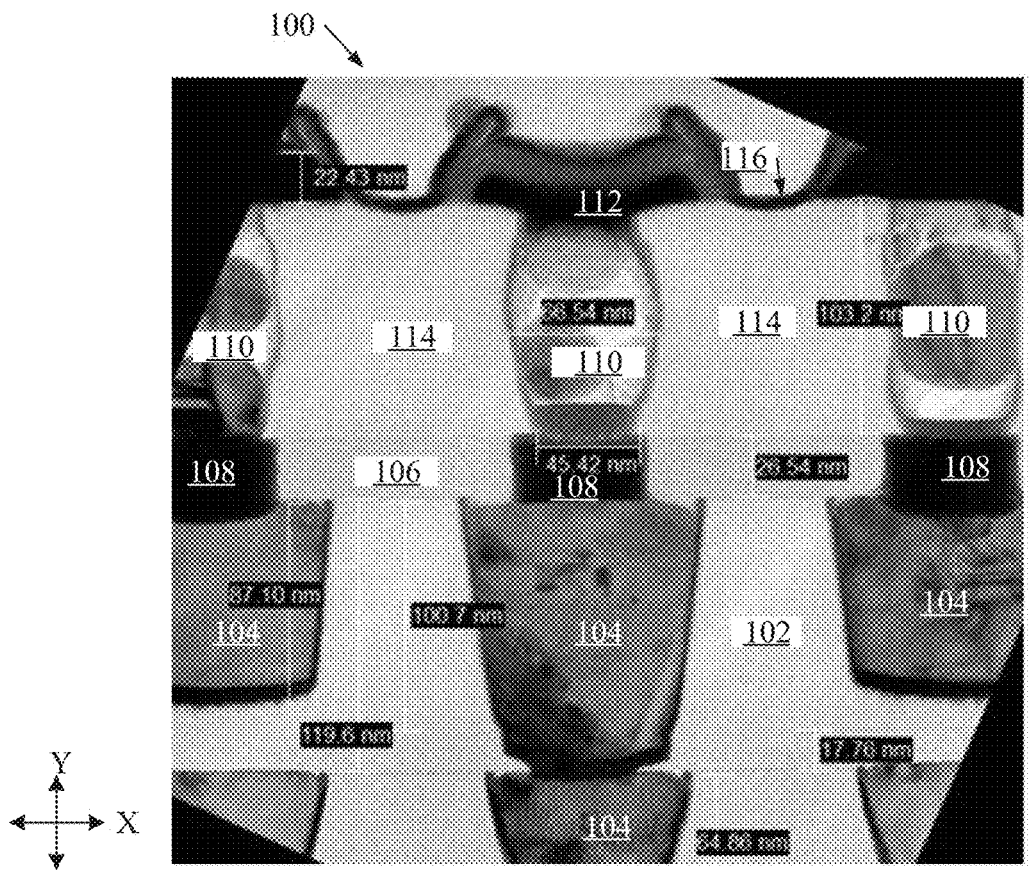
FIG. 4A illustrates a photo of an example, non-limiting phase change memory that can comprise one or more dielectric bi-layers, which can facilitate one or more additive patterning processes, in accordance with one or more embodiments described herein.
Figure 4B:
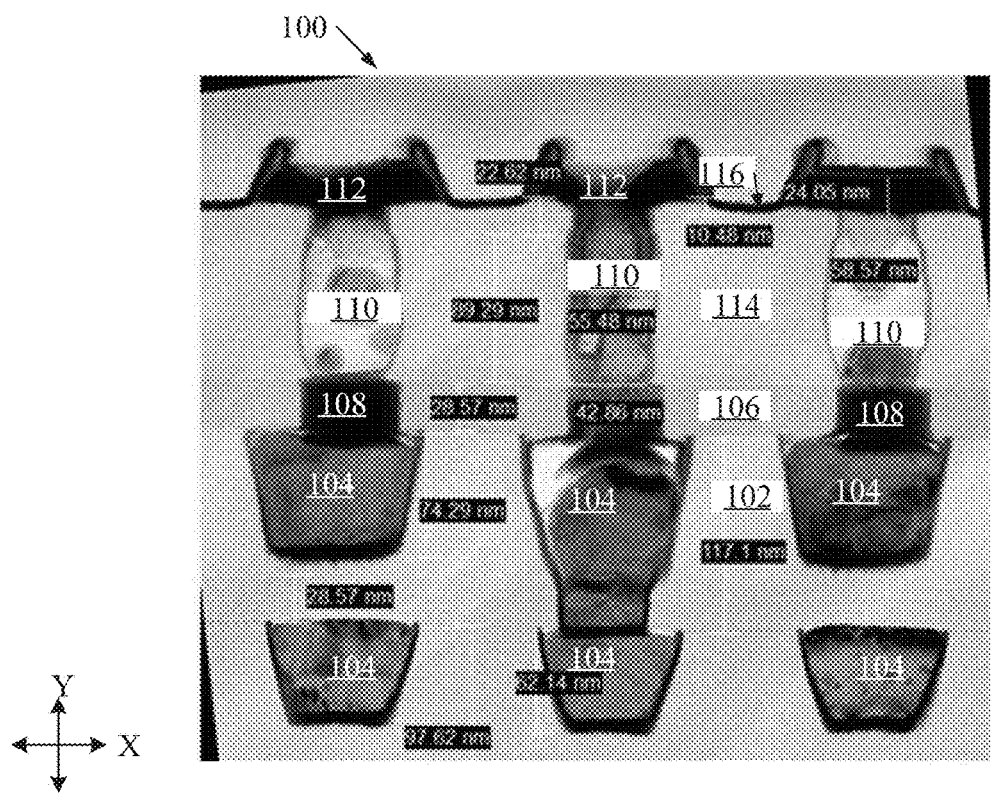
FIG. 4B illustrates a photo of an example, non-limiting phase change memory that can comprise one or more dielectric bi-layers, which can facilitate one or more additive patterning processes, in accordance with one or more embodiments described herein.

FIGS. 4A and/or 4B illustrate photos of example, non-limiting phase change memory structures 100 that can comprise a dielectric bi-layer in accordance with one or more of the embodiments described herein. Repetitive description of like elements employed in other embodiments described herein is omitted for sake of brevity. For example, FIGS. 4A and 4B can depict magnified photos of a phase change memory structure 100 in accordance with one or more embodiments described herein. The one or more second electrodes 112 shown in FIGS. 4A and/or 4B were formed using one or more additive patterning processes. As shown in the magnified photos of FIGS. 4A and/or 4B, the dielectric material 114 can remain substantially free from the recesses and/or gauges that can be caused by additive patterning processes.

Figure 5:
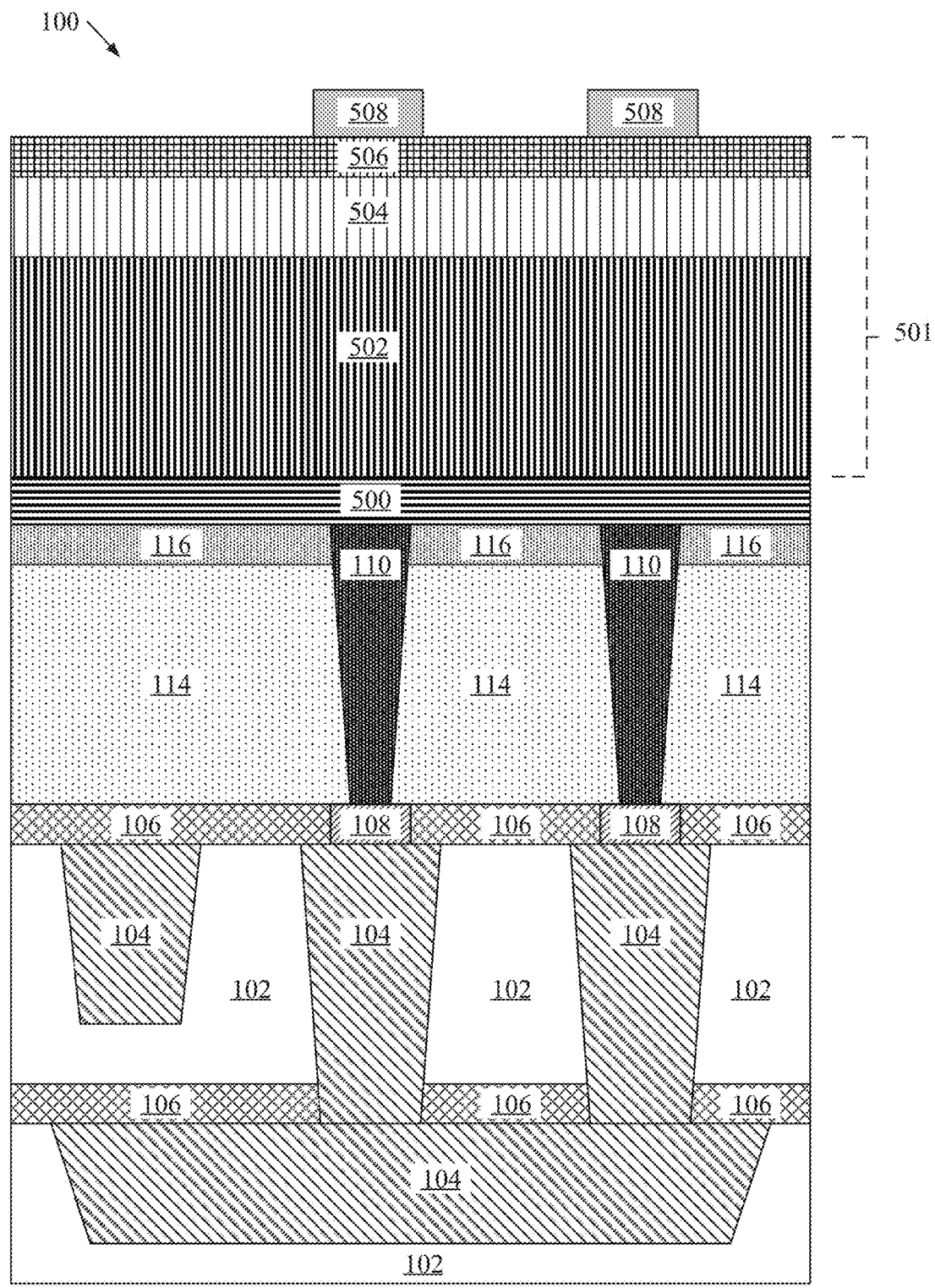
FIG. 5 illustrates a diagram of an example, non-limiting first stage of manufacturing a phase change memory that can comprise one or more dielectric bi-layers, which can facilitate one or more additive patterning processes, in accordance with one or more embodiments described herein.

FIG. 5 illustrates a diagram of an example, non-limiting phase change memory structure 100 at a first stage of manufacturing in accordance with one or more embodiments described herein. Repetitive description of like elements employed in other embodiments described herein is omitted for sake of brevity. At the first stage depicted in FIG. 5, a layer of conductive material 500 can be deposited onto the capping material 116 and/or the one or more phase change memory elements 110. For example, the conductive material 500 (e.g., tantalum nitride) can be deposited using one or more PVD techniques.

Additionally, one or more sacrificial layers 501 can be deposited onto the conductive material 500 (e.g., tantalum nitride). The one or more sacrificial layers 501 can facilitate patterning the conductive material 500 to form the one or more second electrodes 112. For example, FIG. 5 depicts an embodiment comprising three sacrificial layers 501: a silicon nitride layer 502 (e.g., having a thickness ranging from, for example, greater than or equal 25 nm and less than or equal to 100 nm), an organic planarization layer ("OPL") 504 (e.g., having a thickness ranging from, for example, greater than or equal 100 nm and less than or equal to 200 nm), and/or a silicon containing anti-reflective coating ("SiARC") 506 (e.g., having a thickness ranging from, for example, greater than or equal 20 nm and less than or equal to 80 nm). Further, one or more photo-resist masks 508 can be positioned on the one or more sacrificial layers 501 to facilitate the patterning of the conductive material 500. As shown in FIG. 5, the capping material 116 can be positioned between the conductive material 500 and the dielectric material 114.

One of ordinary skill in the art will recognize that the number of sacrificial layers 501, the type of sacrificial layers 501, and/or the thickness of the one or more sacrificial layers 501 can vary based on the conductive material 500 being patterned and/or the functionality of the one or more phase change memory units. For example, in one or more embodiments, the sacrificial layers 501 can comprise fewer or greater than the three layers depicted in FIG. 5.

Figure 6:
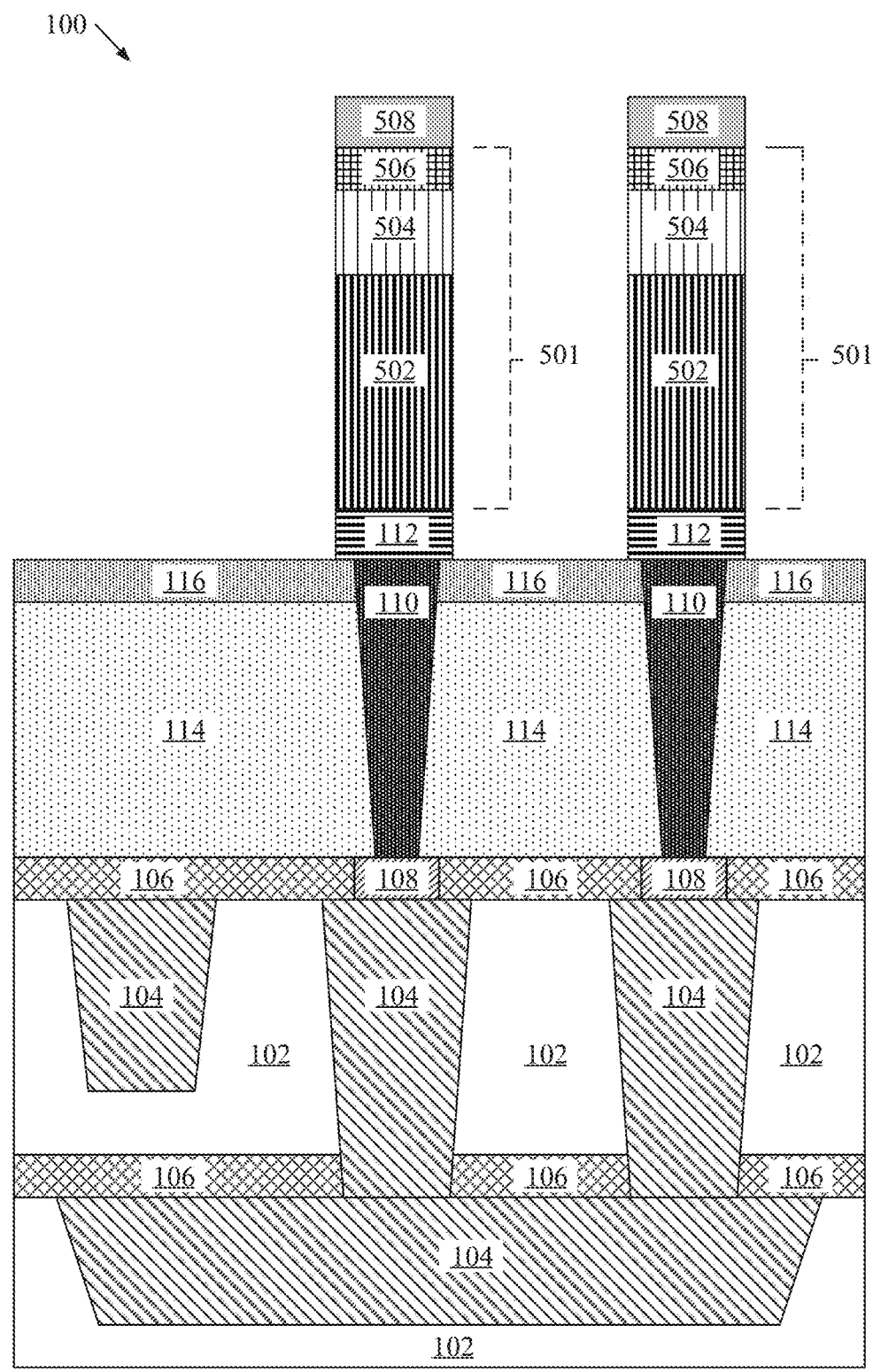
FIG. 6 illustrates a diagram of an example, non-limiting second stage of manufacturing a phase change memory that can comprise one or more dielectric bi-layers, which can facilitate one or more additive patterning processes, in accordance with one or more embodiments described herein.

FIG. 6 illustrates a diagram of an example, non-limiting phase change memory structure 100 at a second stage of manufacturing in accordance with one or more embodiments described herein. Repetitive description of like elements employed in other embodiments described herein is omitted for sake of brevity. At the second stage depicted in FIG. 6, the one or more sacrificial layers 501 and/or the conductive material 500 can be patterned to form the one or more second electrodes 112. The one or more sacrificial layers 501 and/or the conductive material 500 can be patterned using one or more patterning processes (e.g., photolithography techniques) that can include, but are not limited to: RIE, dry etching, and/or wet etching. Subsequently, and/or during the patterning, the one or more photo-resist masks 508 and/or the one or more sacrificial layers 501 can be removed to achieve the phase change memory structure 100 depicted in FIGS. 1-5. As shown in FIG. 6, the capping material 116 can resist the one or more patterning process (e.g., RIE and/or wet etching) utilized to pattern the conductive material 500, and thereby protect the integrity (e.g., thickness) of the dielectric material 114 during the formation of the one or more second electrodes 112.

Figure 7:
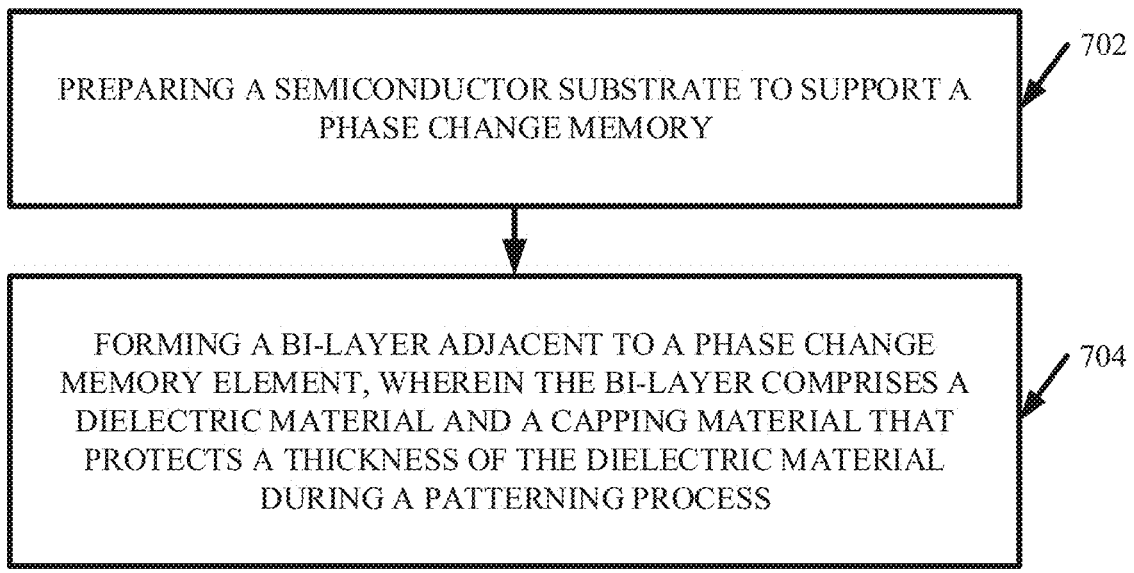
FIG. 7 illustrates a flow diagram of an example, non-limiting method that can facilitate manufacturing a phase change memory that can comprise one or more dielectric bi-layers, which can facilitate one or more additive patterning processes, in accordance with one or more embodiments described herein.

FIG. 7 illustrates a flow diagram of an example, non-limiting method 700 that can facilitate manufacturing one or more phase change memory structures 100, which can comprise a bi-layer in accordance with one or more embodiments described herein. Repetitive description of like elements employed in other embodiments described herein is omitted for sake of brevity.

At 702, the method 700 can comprise preparing a semiconductor substrate 102 to support one or more phase change memories (e.g., one or more phase change memory units comprising one or more first electrodes 108, one or more phase change memory elements 110, and/or one or more second electrodes 112). For example, the preparing at 702 can comprise forming the one or more landing pads 104 and/or the one or more dielectric capping layers 106 (e.g., as described herein with regards to FIG. 1). Additionally, the preparing at 702 can comprise positioning the one or more first electrodes 108.

At 704, the method 700 can comprise forming one or more bi-layers adjacent to the one or more phase change memory elements 110. The one or more bi-layers can comprise a dielectric material 114 and/or a capping material 116. Further, the capping material 116 can protect an integrity (e.g., a thickness) of the dielectric material 114 during one or more patterning processes. For example, the one or more patterning process can comprise RIE and/or wet etching a conductive material 500 to form one or more second electrodes 112. Thus, the one or more phase change memories can be formed using one or more additive patterning processes while negating damage to the dielectric material 114.

Figure 8:
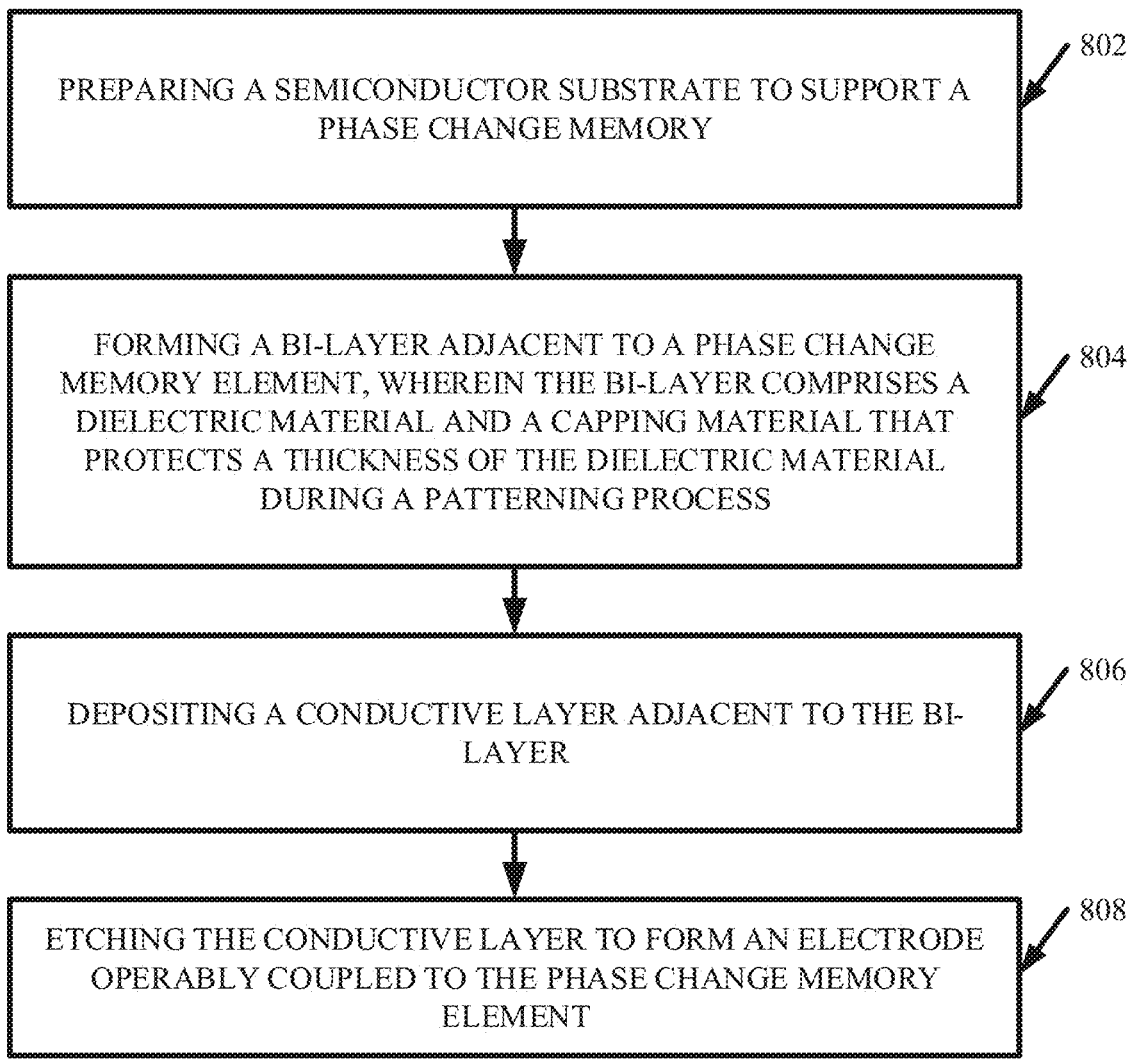
FIG. 8 illustrates a flow diagram of an example, non-limiting method that can facilitate manufacturing a phase change memory that can comprise one or more dielectric bi-layers, which can facilitate one or more additive patterning processes, in accordance with one or more embodiments described herein.

FIG. 8 illustrates a flow diagram of an example, non-limiting method 800 that can facilitate manufacturing one or more phase change memory structures 100, which can comprise a bi-layer in accordance with one or more embodiments described herein. Repetitive description of like elements employed in other embodiments described herein is omitted for sake of brevity.

At 802, the method 800 can comprise preparing a semiconductor substrate 102 to support one or more phase change memories (e.g., one or more phase change memory units comprising one or more first electrodes 108, one or more phase change memory elements 110, and/or one or more second electrodes 112). For example, the preparing at 802 can comprise forming the one or more landing pads 104 and/or the one or more dielectric capping layers 106 (e.g., as described herein with regards to FIG. 1). Additionally, the preparing at 802 can comprise positioning the one or more first electrodes 108.

At 804, the method 800 can comprise forming one or more bi-layers adjacent to the one or more phase change memory elements 110. The one or more bi-layers can comprise a dielectric material 114 and/or a capping material 116. Further, the capping material 116 can protect an integrity (e.g., a thickness) of the dielectric material 114 during one or more patterning processes. For example, the one or more patterning process can comprise RIE and/or wet etching a conductive material 500 to form one or more second electrodes 112. The dielectric material 114 can have a dielectric constant less than or equal to 3.9. Also, the capping material 116 can be etch resistant. Example materials that can comprise the capping material 116 can include, but are not limited to: TEOS, silicon nitride, alumina, NBLOK, a combination thereof, and/or the like.

At 806, the method 800 can comprise depositing a conductive layer adjacent to the bi-layer. For example, the conductive layer can be conductive material 500. Further, the conductive layer can be deposited using one or more PVD techniques. Additionally, the conductive layer can be deposited onto the bi-layer such that the capping material 116 can be positioned between the conductive layer and the dielectric material 114.

At 808, the method 800 can comprise etching the conductive layer to form one or more electrodes (e.g., one or more second electrodes 112) operably coupled to the one or more phase change memory elements 110. The etching at 808 can comprise, for example, RIE and/or wet etching processes. Further, as described herein, the capping material 116 can protect the dielectric material 114 from the etching at 808 and/or any additional patterning processes. In one or more embodiments, the conductive layer can comprise tantalum nitride and the capping material 116 can protect the dielectric material 114 from being modified as a result of patterning the tantalum nitride (e.g., via the etching at 808).

Figure 9:
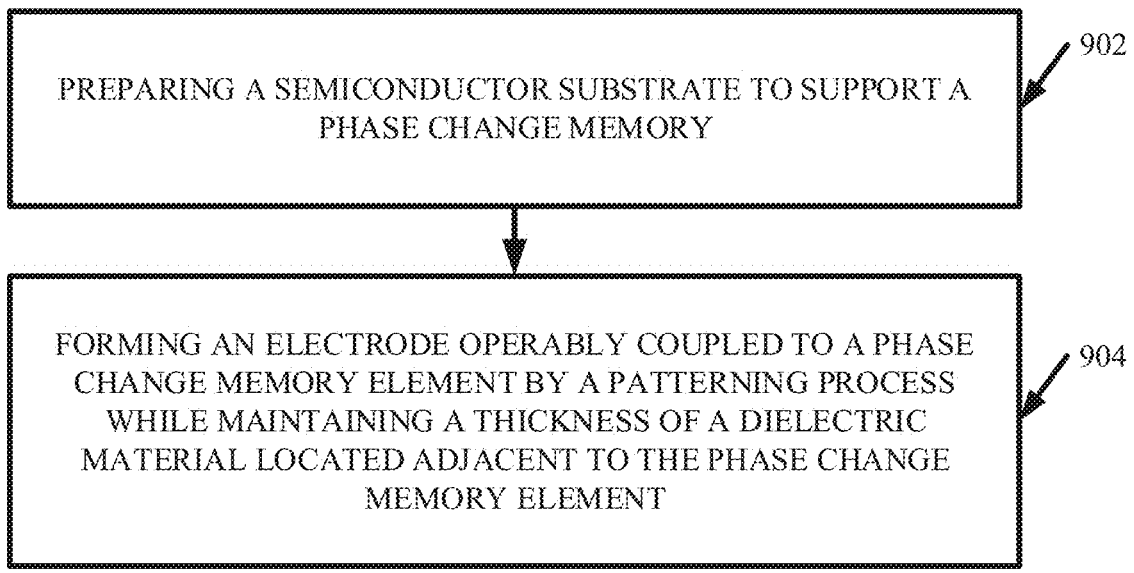
FIG. 9 illustrates a flow diagram of an example, non-limiting method that can facilitate manufacturing a phase change memory that can comprise one or more dielectric bi-layers, which can facilitate one or more additive patterning processes, in accordance with one or more embodiments described herein.

FIG. 9 illustrates a flow diagram of an example, non-limiting method 900 that can facilitate manufacturing one or more phase change memory structures 100, which can comprise a bi-layer in accordance with one or more embodiments described herein. Repetitive description of like elements employed in other embodiments described herein is omitted for sake of brevity.

At 902, the method 900 can comprise preparing a semiconductor substrate 102 to support one or more phase change memories (e.g., one or more phase change memory units comprising one or more first electrodes 108, one or more phase change memory elements 110, and/or one or more second electrodes 112). For example, the preparing at 902 can comprise forming the one or more landing pads 104 and/or the one or more dielectric capping layers 106 (e.g., as described herein with regards to FIG. 1). Additionally, the preparing at 902 can comprise positioning the one or more first electrodes 108.

At 904, the method 900 can comprise forming one or more electrodes (e.g., second electrodes 112) operably coupled to one or more phase change memory elements 110 by one or more pattering processes while maintaining a thickness of a dielectric material 114 located adjacent to the one or more phase change memory elements 110. For example, the forming at 904 can be facilitated by one or more etching processes such as RIE and/or wet etching. Also, in one or more embodiments the one or more electrodes can comprise tantalum nitride. Further, the thickness of the dielectric material 114 can be protected by a capping material 116 positioned adjacent to the dielectric material 114 to form a bi-layer surrounding the one or more phase change memory elements 110 (e.g., as shown in FIG. 1).

FIG. 10 illustrates a flow diagram of an example, non-limiting method 1000 that can facilitate manufacturing one or more phase change memory structures 100, which can comprise a bi-layer in accordance with one or more embodiments described herein. Repetitive description of like elements employed in other embodiments described herein is omitted for sake of brevity.

At 1002, the method 1000 can comprise preparing a semiconductor substrate 102 to support one or more phase change memories (e.g., one or more phase change memory units comprising one or more first electrodes 108, one or more phase change memory elements 110, and/or one or more second electrodes 112). For example, the preparing at 1002 can comprise forming the one or more landing pads 104 and/or the one or more dielectric capping layers 106 (e.g., as described herein with regards to FIG. 1). Additionally, the preparing at 1002 can comprise positioning the one or more first electrodes 108.

At 1004, the method 1000 can comprise depositing a capping material 116 adjacent to a dielectric material 114 and/or one or one or more phase change memory elements 110. The capping material 116 can separate an electrically conductive layer (e.g., comprising conductive material 500) from the dielectric material 114. For example, the capping material 116 can comprise TEOS, silicon nitride, alumina, NBLOK, a combination thereof, and/or the like. Further, the depositing at 1004 can include one or more PVD techniques.

At 1006, the method 1000 can comprise forming one or more electrodes (e.g., second electrodes 112) operably coupled to the one or more phase change memory elements 110 by one or more pattering processes while maintaining a thickness of the dielectric material 114. Also, the electrically conductive layer (e.g., comprising conductive material 500) can comprise the one or more electrodes (e.g., one or more second electrodes 112). For example, the forming at 1006 can be facilitated by one or more etching processes such as RIE and/or wet etching. Also, in one or more embodiments the electrically conductive layer can comprise tantalum nitride to facilitate formation of one or more tantalum nitride electrodes. Further, the capping material 116 and/or the dielectric material 114 can form a bi-layer surrounding the one or more phase change memory elements 110 (e.g., as shown in FIG. 1). In one or more embodiments, the dielectric material 114 can have a dielectric constant less than or equal to 3.9.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

It is, of course, not possible to describe every conceivable combination of components, products and/or methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim. The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method, comprising:
forming a bi-layer adjacent to a side of a phase change memory element and above a bottom electrode of the phase change memory element, wherein the bi-layer comprises a dielectric material and a capping material that protects a thickness of the dielectric material during a patterning process to form a top electrode of the phase change memory element.

2. The method of claim 1, wherein the capping material is a material selected from a group consisting of tetraethyl orthosilicate, silicon nitride, alumina, and a nitrogen-doped silicon carbide.

3. The method of claim 1, further comprising:
depositing a conductive layer adjacent to the bi-layer; and
etching the conductive layer to form the top electrode operably coupled to the phase change memory element.

4. The method of claim 2, wherein the dielectric material has a dielectric constant that is less than or equal to about 3.9.

5. The method of claim 4, wherein the patterning process comprises patterning a tantalum nitride layer to form the top electrode that is operably coupled to the phase change memory element.

6. The method of claim 3, wherein the etching comprises reactive-ion etching.

7. The method of claim 6, wherein the etching further comprises wet etching.

8. A method, comprising:
forming a top electrode operably coupled to a phase change memory element by a patterning process while maintaining a thickness of a dielectric material located adjacent to the phase change memory element, by forming a bi-layer adjacent to a side of the phase change memory element and above a bottom electrode of the phase change memory element, wherein the bi-layer comprises the dielectric material and a capping material that protects the thickness of the dielectric material during the patterning process.

9. The method of claim 8, wherein the dielectric material has a dielectric constant that is less than or equal to about 3.9.

10. The method of claim 8, further comprising:
depositing the capping material adjacent to the dielectric material and the phase change memory element, wherein the capping material separates an electrically conductive layer from the dielectric material, and wherein the electrically conductive layer comprises the electrode.

11. The method of claim 8, wherein the dielectric material has a dielectric constant that is less than or equal to about 3.9.

12. The method of claim 8, wherein the patterning comprises reactive-ion etching.

13. The method of claim 10, wherein the capping material is a material selected from a group consisting of tetraethyl orthosilicate, silicon nitride, alumina, and a nitrogen-doped silicon carbide.

14. The method of claim 13, wherein the electrically conductive layer comprises tantalum nitride.

15. The method of claim 14, wherein the patterning comprises wet etching.

16. An apparatus, comprising:
an electrode operably coupled to a top of a phase change memory element; and
a bi-layer adjacent to a side of the first electrode the phase change memory element and above a bottom electrode of the phase change memory element, wherein the bi-layer comprises a dielectric material and an etch-resistant capping material that is positioned between the dielectric material and the electrode.

17. The apparatus of claim 16, wherein the phase change memory element comprises a phase change material.

18. The apparatus of claim 16, wherein the capping material is a material selected from a group consisting of tetraethyl orthosilicate, silicon nitride, alumina, and a nitrogen-doped silicon carbide.

19. The apparatus of claim 18, wherein the dielectric material has a dielectric constant that is less than or equal to about 3.9.

20. The apparatus of claim 19, where in the electrode is a patterned tantalum nitride layer.

* * * * *